United States Patent [19]

Herrmann

[11] 4,140,923
[45] Feb. 20, 1979

[54] CHARGE TRANSFER OUTPUT CIRCUITS

[75] Inventor: Eric P. Herrmann, Bound Brook, N.J.

[73] Assignee: RCA Corporation, New York, N.Y.

[21] Appl. No.: 854,892

[22] Filed: Nov. 25, 1977

[51] Int. Cl.² ............... G11C 19/28; H01L 29/78; H01L 29/04; H03H 7/28
[52] U.S. Cl. ............... 307/221 D; 357/24; 357/59; 333/70 T
[58] Field of Search ............... 357/24; 307/221 D; 333/70 T

[56] References Cited

U.S. PATENT DOCUMENTS

| 3,623,132 | 11/1971 | Green | 357/24 |
|---|---|---|---|
| 3,758,794 | 9/1973 | Kosonocky | 357/24 |
| 3,937,985 | 2/1976 | Cooper | 357/24 |
| 3,986,198 | 10/1976 | Kosonocky | 357/24 |
| 4,034,199 | 7/1977 | Lampe et al. | 357/24 |
| 4,040,077 | 8/1977 | Tchon | 357/24 |

FOREIGN PATENT DOCUMENTS 976662  10/1975  Canada ............... 357/24

OTHER PUBLICATIONS

Stinson "Regenerative Photocell Using Charge-Coupled Device Structure", IBM Tech. Disclosure Bulletin, vol. 16, (7/73), pp. 632-633.
Wen "Design and Operation of a Floating Gate Amplifier", IEEE J. Solid-State Circuits, vol. SC-9, (12/74), pp.410-414.
Sequin et al., Charge Transfer Devices, Academic Press, N. Y., (7/75), pp. 4, 28-30, 42-44, 48-50, 56, 57.
Herrman "High Speed CCD Line Imager", RCA Technical Note No. 1154, (6/76) 4 pp.

Primary Examiner—William D. Larkins
Assistant Examiner—Gene M: Munson
Attorney, Agent, or Firm—H. Christoffersen; Samuel Cohen

[57] ABSTRACT

A plurality of floating regions of a charge transfer device, such as the floating gates of a charge-coupled device (CCD), connected to a corresponding number of output gates to form potential wells beneath these output gates whose depths are charge signal dependent. Control gates selectively couple each well to one of two output regions of opposite conductivity type than the substrate and the selected output regions and output gates are operated in one of a number of possible "fill and spill" modes to produce output signals. One of the output regions at an output gate location, when selected, is employed to produce an output signal proportional to charge and the other, when selected, is employed to produce the complement of the output signal.

8 Claims, 7 Drawing Figures

CHARGE TRANSFER OUTPUT CIRCUITS

The present application deals with charge transfer circuits such as charge coupled devices (CCD's) and particularly with output structures therefor.

It is known in the art to employ floating regions such as diffusions or "floating gate" electrodes as the output electrodes of charge transfer circuits such as CCD's. In some cases there is a single such region at the output end of the CCD. In other cases there are a multiplicity of such regions along the length of a CCD register for producing parallel outputs. During one period of time, such a region (assume it to be a floating gate electrode) may be placed at a potential such that a potential well is present in the substrate beneath the electrode. The change in potential of the gate electrode in response to the shifting into this potential well of a charge signal is employed as an output signal of the CCD.

In a CCD embodying the present invention, the means for sensing the voltage at the gate electrode (or other floating output structure) comprises two regions in the substrate of opposite conductivity than the substrate, and means for selectively coupling either region to the floating output structure. In operation, the selected region is first operated as a source and employed to fill a potential well whose depth is a function of the charge signal stored at the floating structure. Then, the selected region is operated as a drain to receive charge which is spilled from this potential well. A portion, which is signal dependent, of the charge flowing into this drain is sensed and employed as the floating region output signal. One of the output regions, when selected, can be employed to produce an output signal, as described, and the other, when selected, can be employed to produce the complementary output signal.

Figure 4:
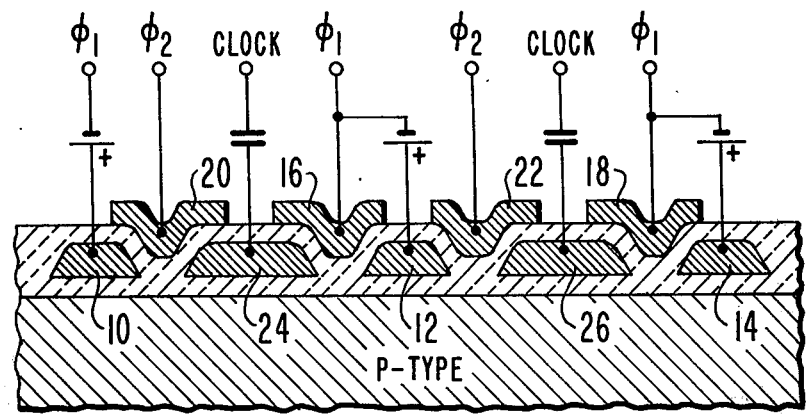
Figure 5:
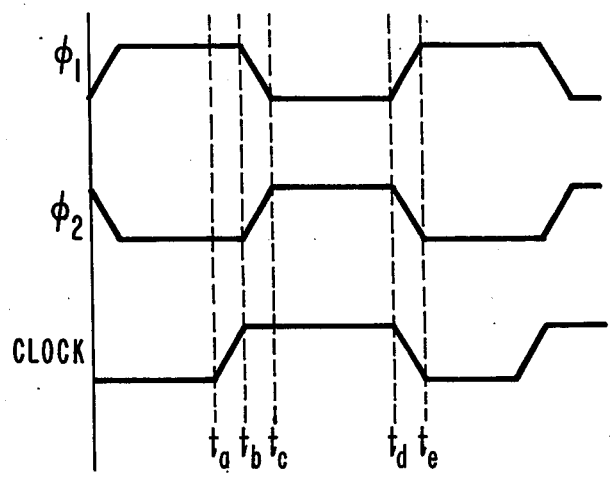
Figure 2:
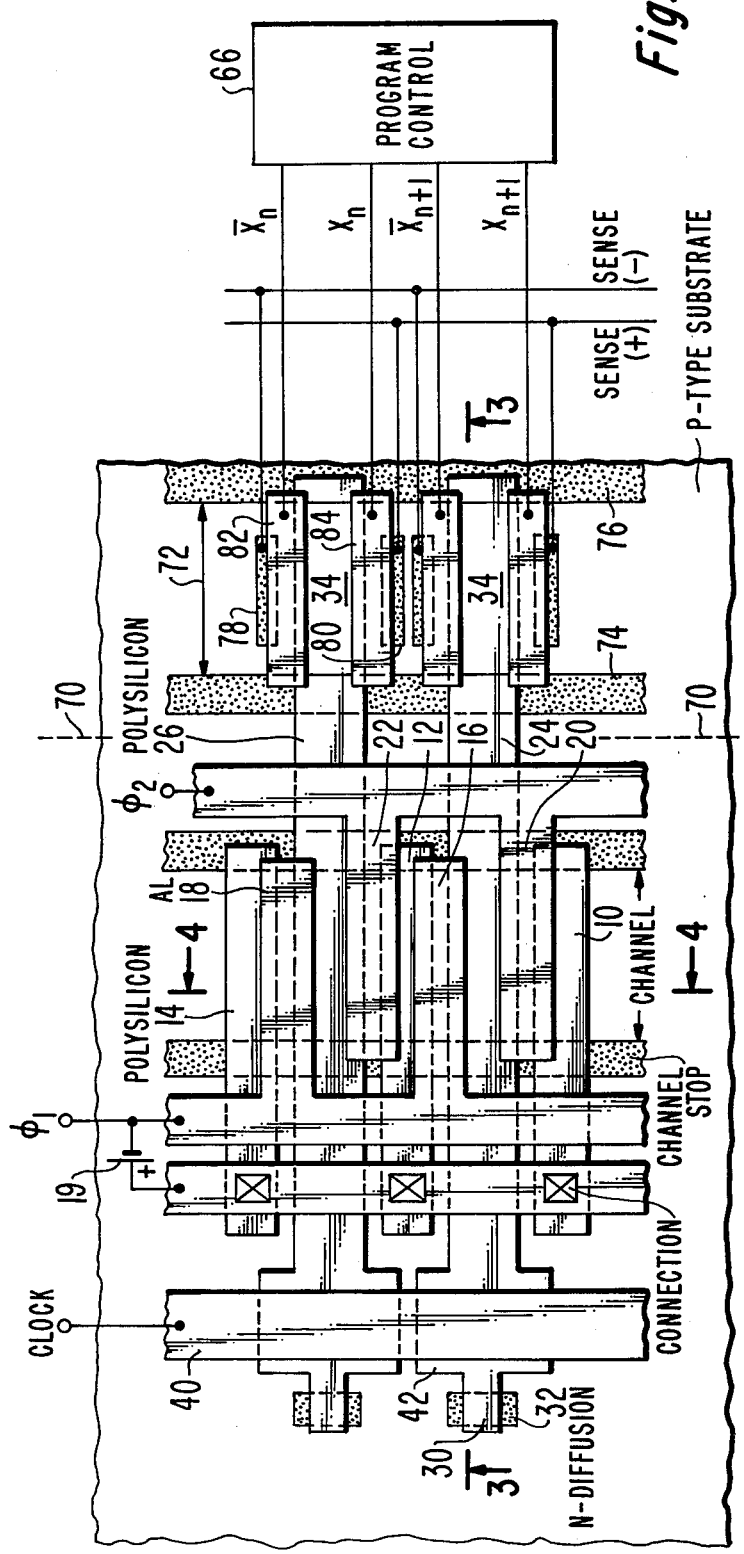
FIG. 2 is a plan view of a portion of a multiple output CCD register embodying the invention.
Figure 3:
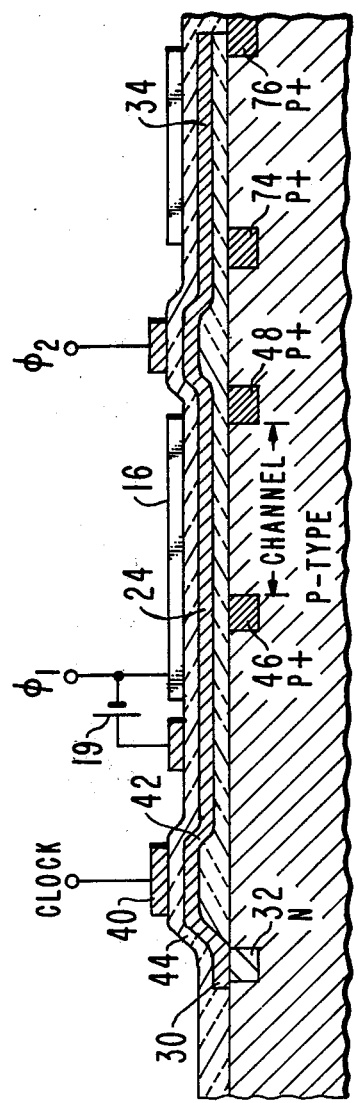
Figure 6:
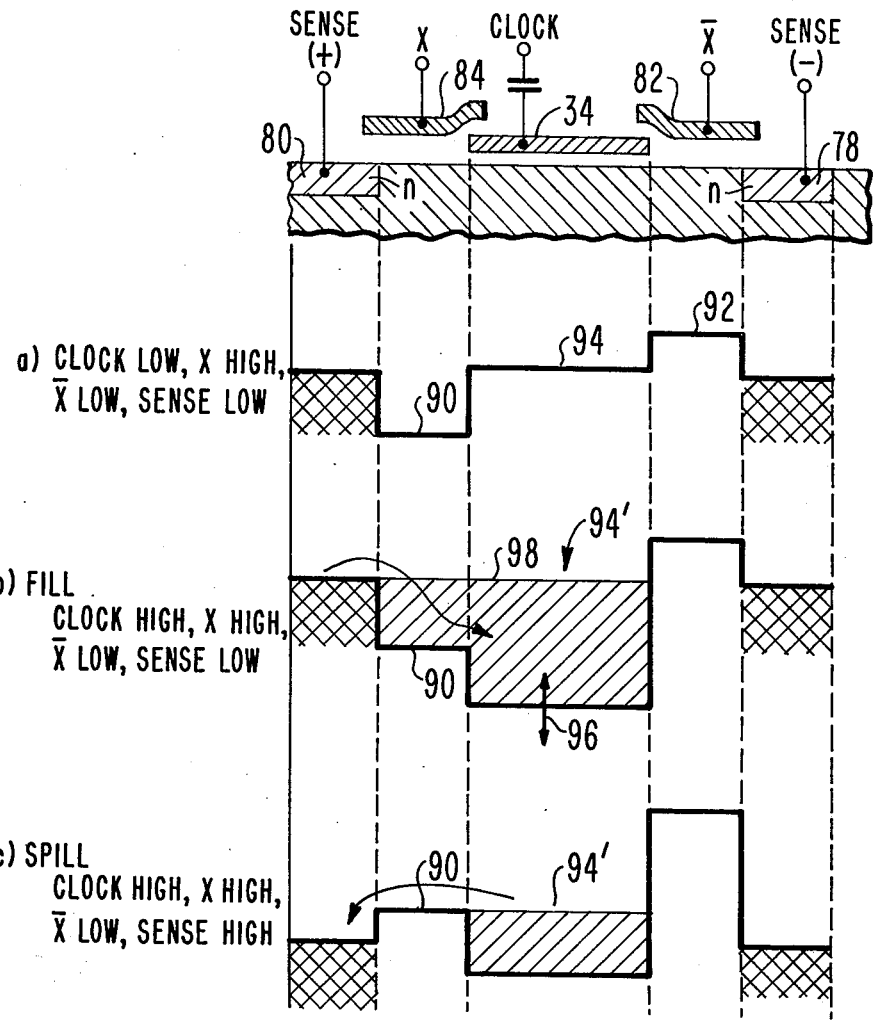
Figure 7:
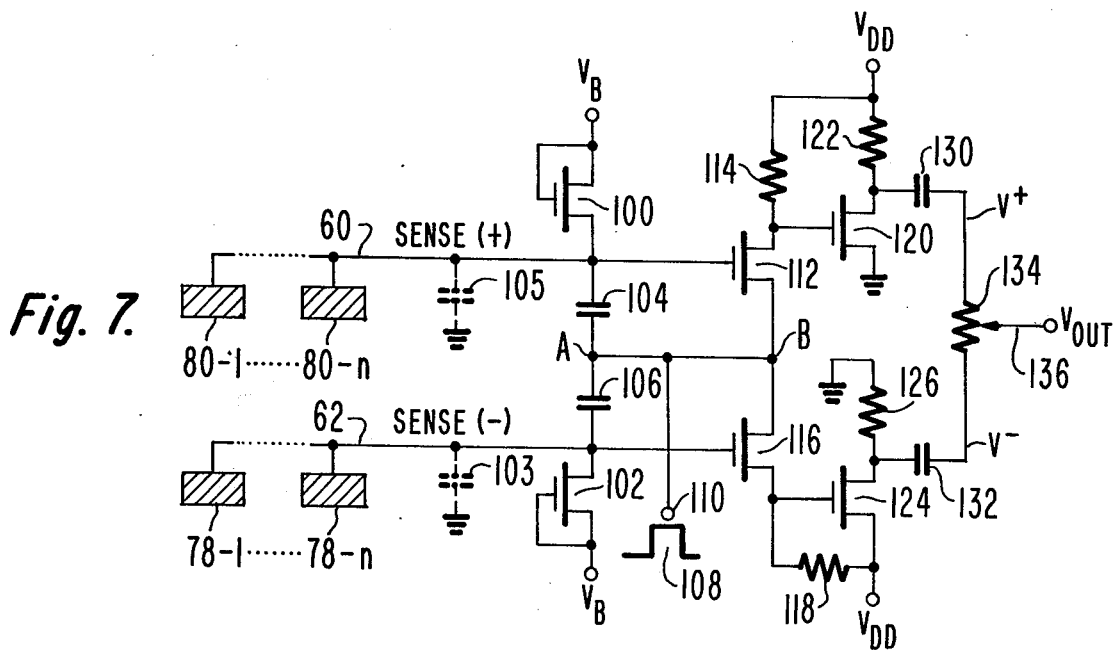

FIG. 3 and 4 are cross sections taken along lines 3—3 and 4—4, respectively, of FIG. 2;

FIG. 5 is a drawing of waveforms that may be used in the operation of the CCD of the previous figures;

FIG. 6 is a drawing of surface potential profiles to help explain the operation of the output structure of FIGS. 2 and 3;

FIG. 7 is a circuit diagram of a sense circuit which may be employed in a system embodying the invention.

Figure 1:
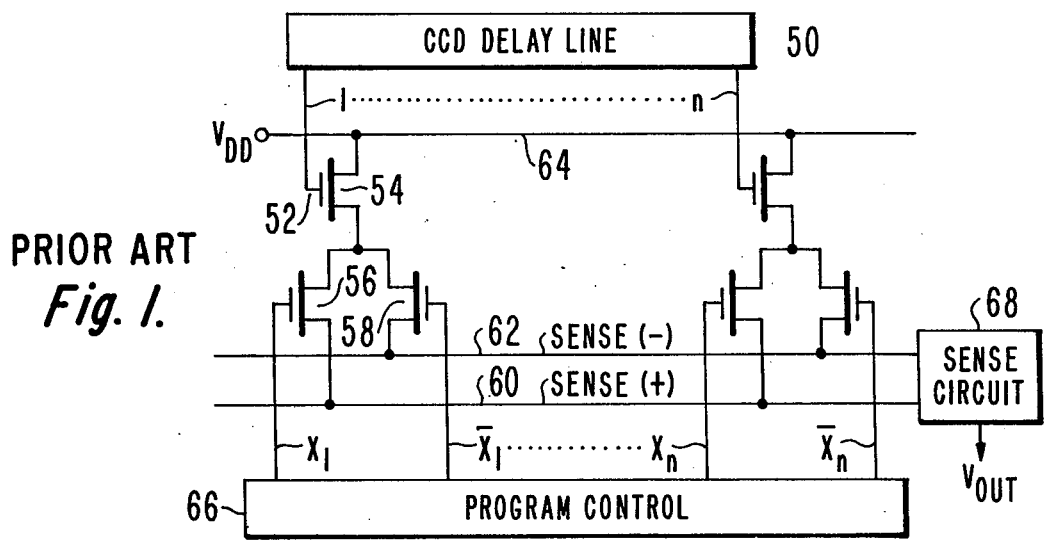
FIG. 1 is a block and schematic diagram of a known signal processing system employing a CCD with parallel outputs.

FIG. 1 illustrates a known CCD system employed in various signal processing applications. It includes a CCD delay line 50 which has a plurality n of output terminals 1 . . . n. Each terminal may connect to a floating region in the CCD delay line, such as a floating diffusion or a floating gate. Each terminal or tap also connects to a field effect transistor output circuit and as the various circuits are identical, only one of them will be described.

Assuming the CCD to be a surface channel P-type substrate (N-channel) device, the MOS transistors illustrated may be N-channel transistors of the enhancement type. A tap such as 1, connects to the gate electrode 52 of MOS transistor 54. The source electrode of this transistor connects to two parallel conduction paths, one through transistor 56 and the other through transistor 58. The source electrode of transistor 56 connects to a plus sense line 60 and the source electrode of transistor 58 connects to a minus sense line 62.

In operation, the power supply bus 64 is maintained at a sufficiently positive level $V_{DD}$ that current flows through the various transistor circuits. The program control 66 applies a voltage $X_1$ to the gate electrode of transistor 56 and the complementary voltage, $\overline{X}_1$ to the gate electrode of transistor 58. Depending upon the particular program, one of the control voltages will be relatively positive to turn its transistor on and the other of the control voltages relatively negative to turn its transistor off. Assume that $X_1$ is relatively positive and transistor 56 is on, and $\overline{X}_1$ is relatively negative to turn transistor 58 off. In like fashion, the program control will cause one transistor of every succeeding pair to be on and the other to be off in accordance with the signal processing function the system is being called upon to perform. The voltage present on the output tap of the CCD delay line, such as the voltage present at 1, which voltage is applied to the gate electrode of transistor 52, will control the amount of current which flows through transistor 54 and the "on" transistor 56 to the plus sense line 60. For example, if there is a large amount of charge present at a floating region (and assuming the charge to be electrons), the gate electrode 52 will be driven relatively negative and this will reduce the current flow to the plus sense line 60; and if there is less charge present at the floating region, more current will flow to the sense line 60.

As already mentioned, the same thing as described above is occurring at the remaining taps of the delay line, that is, in which case either 56 or 58 is on, depending upon the program control voltages, and in each case an amount of current flows to one of the sense lines which is charge signal dependent. The program control may apply the same program of X and $\overline{X}$ voltage levels to the transistors for many sequential clock periods of the CCD, or it may change the program of X, $\overline{X}$ voltages from period to period or after any number of arbitrary periods. In any of these cases, during each operating period the currents passing through all of the on transistors 56 are applied to (+) sense line 60 where they are summed, and the currents passing through all of the on transistors 58 are applied to the (—) sense line 62 where they are summed. The sense circuit 68 subtracts the sum of the (—) currents on line 62 from the sum of the (+) currents on line 60 and derives from this difference current an output voltage $V_{OUT}$. The successive output voltages $V_{OUT}$ produced during succeeding clock periods manifest the particular function of interest.

The circuit described above has a number of disadvantages. For example, unless the sense lines are tied to a hard virtual ground, feedback can introduce non-linearity. Further, if, as may be the case, there are a large number of taps (in many applications there may be 100 or more taps) the system will dissipate an appreciable amount of power. In addition, the steady state currents become large under such circumstances and they may be difficult to sense differentially because the difference between the currents on the plus and minus sense lines 60 and 62 may be relatively small compared to the total amount of sense current supplied to the input to the sense circuit 68.

FIGS. 2, 3 and 4 illustrate a system embodying the present invention. In FIG. 2 the structure shown to the left of dashed line 70 is similar to the structure described in copending U.S. application Ser. No. 810,392 for "Charge Coupled Device," issued May 16, 1978 as U.S. Pat. No. 4,090,095 filed June 27, 1977 by the present inventor and assigned to the same assignee as the present application. In the discussion which follows, first this structure will be discussed and then the improved output structure, in which one aspect of the present invention resides, will be discussed.

Referring to FIGS. 2-4, the CCD illustrated comprises an N-channel (P-type substrate) device. For purposes of illustration, the electrodes are shown to be formed of polysilicon overlapped at opposite edges by aluminum electrodes. It is to be understood, of course, that other forms of electrodes, such as all polysilicon, can be employed and that the invention is equally applicable to P-channel (N-type substrate) devices with appropriate choice of voltages. Further, while for purposes of this discussion, the CCD is assumed to be of the surface channel type, the invention is equally applicable to buried channel CCD's.

The polysilicon electrodes driven by one voltage phase $\phi_1$ are shown at 10, 12 and 14. The overlapping aluminum electrodes driven by the same phase are illustrated at 16 and 18. If desired, the $\phi_1$ voltage applied to the electrodes closer to the substrate (polysilicon) may be more positive than that applied to the electrodes further from substrate (aluminum) as indicated schematically by battery 19. The phase 2 ($\phi_2$) electrodes also are aluminum and are illustrated at 20 and 22. Each such electrode overlaps at one edge a polysilicon phase 1 electrode and at its other edge an output electrode, two such output electrodes being shown at 24 and 26, respectively.

Each output electrode is insulated from the substrate over the major portion of its length and is connected at one end portion 30 thereof to a region 32 in the substrate of opposite conductivity than the substrate. This region 32 may be a diffusion and may be of N conductivity type. The other end portion 34 of an output electrode serves as part of the output structure to be discussed later.

The output electrodes 24 and 26 receive their drive voltage from a clock voltage source which is connected to conductor 40. Conductor 40 passes over expanded regions such as 42 of the output electrodes and is capacitively coupled at these expanded regions to the output electrodes via a silicon dioxide (SiO$_2$) insulation layer 44.

The CCD channel is defined by two diffusions 46 and 48 in the substrate of the same conductivity type as the substrate but of higher impurity concentration than the substrate. The function of these "channel stops" is well understood and need not be discussed further.

The operation of the CCD just discussed may be better understood by referring to the waveforms of FIG. 5. It may be assumed that charge signal has been introduced into the CCD via an input structure (not shown). It may also be assumed that when $\phi_1$ goes high, this charge signal (electrons in the case of the P-type substrate assumed) transfers to the potential well in the region of the substrate beneath polysilicon electrode 10. Typical voltage levels for $\phi_1$ are 0 to 10 volts and the voltage offset between the aluminum and polysilicon $\phi_1$ electrodes may be 2 volts (the voltage provided by battery 19). These are examples only, the particular value chosen in any instance depending upon such design criteria as the materials employed, the insulation thickness, the maximum amount of charge it is desired to propagate in each "packet" and so on.

During the period $t_a$ to $t_b$, CLOCK goes high. When CLOCK goes high, the output electrode 24 is driven relatively positive by virtue of the capacitive coupling between conductor 40 and the expanded region 42 of the output electrode. Electrode 42 is ohmically connected to diffusion 32 so that this diffusion also is driven relatively positive. The positive voltage on diffusion 32 reverse biases the P-N junction between diffusion 32 and the P-type substrate so that electrode 24 is electrically isolated from the substrate.

When CLOCK goes high in the period $t_a$-$t_b$, charge signal may be present at the substrate surface beneath electrode 10. However, the potential barrier beneath electrode 20 prevents this charge from propagating to the potential well beneath output electrode 24. Similarly, charge may be present in the potential well beneath electrode 12. However, the shallower potential well beneath electrode 16 prevents the propagation of charge backward from the well beneath electrode 12 to the well beneath electrode 24.

During the period $t_b$-$t_c$, $\phi_1$ goes low (to ground, for example) and $\phi_2$ goes relatively positive but not as positive as output electrode 24. For example, $\phi_2$ may be at +10 volts and CLOCK may be at +12 volts in the case in which $\phi_1$ varies between +10 volts and ground and in which the battery voltage is 2 volts. The charge carriers stored in the potential well beneath electrode 10 now propagate via the potential well beneath $\phi_2$ electrode 20 to the relatively deeper potential well beneath output electrode 24. The change in potential of electrode 24 which results is detected in the manner to be discussed later. And in corresponding fashion the charge in potential at the remaining electrodes is concurrently detected so that a plurality of signals, in parallel, are produced. Such CCD structures in which multiple output signals, in parallel, are produced are useful in pattern matching circuits, filters and in many other applications.

After the multiple output signals are sensed, $\phi_2$ and CLOCK go relatively negative (time $t_d$-$t_e$) for example, to ground, and concurrently $\phi_1$ goes relatively positive. This causes the shift of charge signal from the potential well beneath electrode 24 to the relatively deeper potential well beneath electrode 12 via the relatively shallower well beneath electrode 16. During the transition of electrode 24 from its relatively positive to its relatively negative value (time $t_d$-$t_e$) the semiconductor junction between diffusion 32 and the substrate becomes forward biased. This clamps electrode 24 to the substrate potential. Thus, the output electrodes automatically are clamped to a reference level, namely the substrate potential, each time charge signals pass from beneath these electrodes to the following electrodes of the CCD and they remain at this level until CLOCK again goes relatively positive.

The output structure for the CCD comprises a CCD channel 72 defined by two channel stops 74 and 76. Each extension 34 of the floating gate electrode has associated with it, two additional gate electrodes and two N-type regions which may be diffusions. As the structure for each floating gate is the same, only one group of elements will be described. It includes diffusions 78 and 80 both within channel 72 and one on each side of the extension 34 of the floating gate electrode. An electrode 82 overlaps the adjacent edges of extension 34 and diffusion 78 and a second electrode 84 overlaps adjacent edges of extension 34 and diffusion 80. An enlarged cross-sectional view of these elements is shown in FIG. 6 which also depicts the operation.

Referring now to FIG. 6, assume first that CLOCK is low so that there is no charge present beneath a floating gate. Assume also that the program control is maintaining electrode 84 relatively positive so that there is a potential well 90 present beneath this electrode and is maintaining electrode 82 less positive so that there is a potential barrier 92 beneath electrode 82. Further, as electrode 34 is at a relatively negative potential, the surface potential 94 beneath extension 34 of the floating gate is such that a somewhat shallower barrier is present than beneath electrode 82. This condition of the circuit is depicted at a in FIG. 6. During any one period of operation, X and $\overline{X}$ will be maintained at the same values stated so that there will be no input supplied to the sense (−) diffusion 78 and only the sense (+) diffusion 80 will receive the signal in the manner to be discussed.

Assume now that CLOCK has gone high and that a charge has become stored beneath a floating gate. When the CLOCK goes high a potential well 94′ forms beneath extension 34. The depth of this well is signal dependent, that is, it is dependent on the amount of charge stored beneath the floating gate of which 34 is an extension. This is depicted schematically by the arrow 96 in profile b of FIG. 6. In more detail, when the amount of charge (electrons) stored beneath the floating gate increases, the well 94′ becomes shallower and when the amount of charge stored beneath the floating gate decreases, the well 94′ becomes deeper. During this period, the diffusion 80 is maintained at a relatively negative voltage level so that it acts as a source of electrons. These electrons flow from diffusion 80 through the relatively shallow well 90 beneath electrode 84 and into the potential well 94′ and fill well 94′ to level 98. The same thing occurs at each and every extension 34.

There are a number of modes of operation possible for the circuit of FIG. 6 and two of them will be described. In the first mode, region 80, when it is acting as a source of electrons, is connected to an unlimited supply of electrons. Here, during the step depicted at b in FIG. 6, each and every well will fill to the same level 98 during each period of operation, regardless of how much charge is being stored under the respective floating gate electrons, and regardless of the total charge stored under all of the floating gate electrodes. In this first mode of operation, after all of the wells 94′ have been filled, the potential of region 80 is made more positive so that region 80 acts as a drain. The potential X applied to gate electrode 84 remains the same so that potential barrier 90 remains at the same level. The excess charge in well 94′ now spills into the drain. This amount of excess charge is not dependent on the amount of charge signal stored beneath the floating gate of which 34 is in extension and is not sensed by the sense circuit. Rather it is permitted to drain away, for example, through a resistor in the sense circuit. The amount of charge remaining in well 94′, however, is signal dependent. At a later time, not illustrated, the clock voltage again goes relatively negative while region 80 is still operated as a drain and while potential barrier 90 remains at its same level. The charge remaining in well 94′ now spills in its entirety over barrier 90 and into the drain. This charge is added to the charge from all of the remaining wells 94′ in the system at the sense (+) line connected to all of the regions 80 to produce a (+) sum charge which is supplied to the sense circuit. The sense circuit, in similar fashion, concurrently receives a sum (−) charge which is the sum of the charges supplied by the diffusions 78. The sense circuit subtracts the sum (−) charge from the sum (+) charge and derives from the difference an output voltage $V_{OUT}$.

The second mode of operation, which is at present considered the preferred mode of operation, employs a measured amount of charge during the fill portion of the operating cycle. The way in which a measured amount of charge may be obtained is discussed later in connection with FIG. 7. This measured amount of charge is available for supply to all of the regions 80. During the time depicted at b in FIG. 6, this measured amount of charge fills the respective potential wells 94′. All of the wells 94′ will be filled to the same level 98 during one particular operating period. However, 98 may not be the same from one period to the next. For example, at one extreme, assume that all of the floating gates which are electrically connected to the source 80 by a gate electrode 84 to which a positive X voltage is applied are storing a maximum amount of charge (electrons). In this case, during time b, all of these wells 94′ will be relatively shallow. In this case, during the fill period, all of these wells will be filled to a relatively high level 98 by the fixed amount of charge supplied to the diffusions 80. On the other hand, if the respective floating gates all are relatively empty during the fill period, then all of the potential wells 94′ will be relatively deep. In this instance, the level 98 at the termination of the fill period shown at b in FIG. 6 will be relatively lower than in the previous example.

In the second mode of operation, during the spill portion of the cycle as illustrated at c, the amount of charge returned from well 94′ to the diffusion 80 will be signal dependent. The reason it is signal dependent should be apparent from the discussion above and that is that during a particular period, the level 98 to which all of the wells 94′ fill, will be signal dependent. In this second mode of operation, the sense amplifier is active, that is, it produces an output signal in response to the charge flowing from well 94′ to the diffusion 80 during the period depicted at c.

While for purposes of illustration, the operation discussed above is one in which charge flows to the sense (+) diffusion 80, the same type of operation is generally concurrently occurring at certain of the output taps at the sense (−) diffusion 78. At these other taps, the program control places X at a relatively negative value (actually a less positive value) and $\overline{X}$ at a more positive value. This makes diffusion 78 the "active" element and effectively disconnects diffusion 80 from the circuit at these other taps.

Referring now to FIG. 7 which shows a sense circuit which is suitable for operating the circuit in the second mode, all of the sense (+) diffusions 80-1 . . . 80-n connect to the sense (+) bus 60 and all of the sense (−) diffusions 78-1 . . . 78-n connect to the sense (−) bus 62. These buses are biased via circuits which include transistors 100 and 102, each being connected to operate as a diode. The equal valued capacitors 104 and 106 connected between line 60 and terminal A and line 62 and terminal A, respectively, serve as integrating capacitors. The diode connected transistors 100 and 102 are designed to have a relatively large impedance $R_B$ in the forward direction such that $R_B C_I$ is large relative to a sense period, where $C_I$ is the capacitance of an integrating capacitor such as 104. Elements 105 and 103 are the distributed capacitances of lines 60 and 62, respectively.

During the "fill" part of the readout period, the strobe voltage 108 is at a relatively negative level and the diffusions 78 and 80 operate as sources of electrons and fill the wells beneath extensions 34, FIG. 6, in the manner already described. In view of the relatively long time constants $R_BC_f$, compared to the "fill" time, the effect is the same as that obtained with a capacitor storing a fixed amount of charge connected between each line and ground. This capacitor in one case (for line 60) has a value equal to $C_{104}+C_{105}$ and in the other case (for line 62) has a value equal to $C_{106}+C_{103}$, where C followed by a subscript represents the capacitance of the element identified by that subscript.

During the "spill" part of the readout period, which with this particular circuit corresponds to the sense period, a positive strobe pulse 108 is applied from terminal 110 to node A. This causes the diode connected transistors 100 and 102 to be back biased, turning them off, and this allows the sense lines to float. The lines float at a relatively positive level and cause the diffusions 78 and 80 to operate as drains. The charges returning to the drains cause the line potentials to change in an amount dependent upon the amount of signal charge which is present, in one case at the floating gates coupled to the sense (+) diffusions 80, and in the other case at the flowing gates coupled to the sense (−) diffusions 78. These changes in line potential comprise the (+) and (−) input signals to the sense amplifier.

The signal voltage on the sense line 60 is amplified by the inverting amplifier which comprises transistor 112 and resistor 114, and the signal voltage on the sense line 62 is amplified by the substantially identical inverting amplifier comprising transistor 116 and resistor 118. The strobe pulse source depicted by pulse 108 supplies its output to terminal B at the source electrodes of transistors 112 and 116. However, the strobe pulse swing is suitably chosen so that the gate-to-source potential of transistors 112 and 116 is unchanged by this positive excursion. Note that this pulse is applied both to the source and the gate electrodes of each transistor.

Amplifier 112, 114 is followed by a second inverting amplifier comprising transistor 120 and resistor 122, transistor 120 being directly connected at its source electrode to ground. Amplifier 116, 118 is followed by a non-inverting amplifier comprising transistor 124 and resistor 126. This amplifier is operated as a source follower, its source electrode being connected through resistor 126 to ground. The output voltages produced by the two output amplifiers 120, 122 and 124, 126, respectively, are applied through coupling capacitors 130 and 132 to the respective opposite ends of potentiometer 134. This potentiometer serves to sum the two outputs and to produce a resultant output voltage $V_{OUT}$ at the potentiometer tap 136 defined by the following equations:

$$V_{OUT} = K(V^+ - V^-) \quad (1)$$

$$V_{OUT} = \frac{KC_{34}}{C_{104}+C_{105}}\left[\sum_{i=1}^{N}\phi_{i\,sig}^{+} - \sum_{k=1}^{M}\phi_{k\,sig}^{-}\right] \quad (2)$$

where k is the gain factor of the sensor circuit, $V^+$ is the voltage produced by the sense (+) circuit, $V^-$ is the voltage produced by the sense (−) circuit, C followed by a subscript represents the capacitance of the circuit element identified by that subscript, $\phi_{i\,sig}^{+}$, are the signals appearing at the various extensions 34 of the floating gates which result in currents applied to the (+) bus 60, $\phi_{k\,sig}^{-}$ are the signals which result in currents applied to (−) bus 62, and N+M equal the total number of tapped stages.

While FIG. 7 illustrates operation in a strobed mode, the sense circuit may instead be operated in a non-strobed mode. In this mode the output voltage is given by:

$$V_{OUT} = K\left[\frac{C_{34}}{C_{104}+C_{105}+NC_{84}+NC_{34}}\sum_{i=1}^{N}\phi_{i\,sig}^{+} - \frac{C_{34}}{C_{106}+C_{103}+MC_{82}+MC_{34}}\sum_{k=1}^{M}\phi_{k\,sig}^{-}\right] \quad (3)$$

Some important features of the circuit just described are its low power dissipation, its relatively small size and its linearity. While the system is shown to be especially suitable for a programmable arrangement such as a programmable, tapped, CCD delay line, it is equally applicable to tapped bucket brigade delay lines and to other delay devices having multiple tap output structures.

The various voltage levels given and the conventional structures illustrated are intended as examples only. Alternatives are possible. For example, with respect to the waveforms of FIG. 4, CLOCK and $\phi_2$ may be identical in phase rather than as shown. Further, the structure shown may be operated by 2, 3, 4 or a higher number of power supply phases.

What is claimed is:

1. An output circuit for a charge transfer circuit in which there is an output location which includes an electrically floating region whose potential is affected when a charge signal is shifted to said output location, said circuit comprising:

a semiconductor substrate of given conductivity type;

first electrode means electrically connected to said floating region, said first electrode means being insulated from the substrate and being responsive to the voltage at said floating region for producing a substrate potential proportional thereto;

first and second regions in the substrate of opposite conductivity type than the substrate, both spaced from said first electrode means, each such region being independent of said electrically floating region;

second and third electrode means, both insulated from said substrate and from said first electrode means, said second electrode means extending between said first region and first electrode means for controlling, in response to a signal first control voltage whose level can be controlled, the transfer of charge between said first region and a substrate region beneath said first electrode means, and said third electrode means extending between said second region and said first electrode means for controlling, in response to a single second control voltage whose level can be controlled, the transfer of charge between said second region and said substrate region beneath said first electrode means; and means for applying potentials to said first and second regions for permitting each to operate as a source of charge carriers for said substrate region beneath said first electrode means, the passage of such charge carriers being under the control of said second and third electrode means, respectively, and for applying potentials to said first and second regions for permitting each to operate as a drain for charge carriers from the substrate region beneath said first electrode means, the passage of such charge carriers being under the control of said second and third electrode means, respectively.

2. An output circuit as set forth in claim 1, further including means for applying one of: a) said first control voltage at a level to form a conduction path in the substrate beneath said second electrode means to thereby permit the flow of charge and for concurrently applying said second control voltage at a level to form a potential barrier in the substrate beneath said third electrode means to thereby prevent the passage of charge, and b) said second voltage at a level to form a conduction path in the substrate beneath said third electrode means and for concurrently applying said first control voltage at a level to form a potential barrier in the substrate beneath said second electrode means.

3. An output circuit as set forth in claim 2, wherein said means for applying potentials comprises:
means for concurrently applying a first voltage level to both of said first and second regions for operating both regions as sources of charge carriers and for then concurrently applying a second voltage level to both regions for operating them as drains for charge carriers; and
signal output terminals at said respective regions.

4. An output circuit as set forth in claim 10, wherein said means for applying a first voltage level comprises means for concurrently supplying a packet of charge effectively of fixed size to said first region and a packet of charge effectively of fixed size to said second region.

5. In combination:
a charge coupled device (CCD) delay line which includes a plurality of floating gates for producing a plurality of output signals in parallel; and
a programmable output circuit, said output circuit comprising:
first and second sense lines;
a common substrate of given conductivity type;
a plurality of stages, equal in number to the plurality of floating gates, each such stage coupled to a different floating gate, each such stage including:
first electrode means coupled to a floating gate, said first electrode means being insulated from the substrate;
first and second regions in said substrate of opposite conductivity type than the substrate, each spaced from said first electrode means, said first region coupled to said first sense line and said second region coupled to said second sense line;
second and third electrode means, both insulated from said substrate and from said first electrode means, said second electrode means extending between said first region and said first electrode means for controlling in response to a single first control voltage whose level can be controlled, the conduction of charge between said first region and said first electrode means, and said second electrode means extending between said second region and said first electrode means for controlling in response to a single second control voltage whose level can be controlled, the flow of charge between said second region and said first electrode means; and
program control means for supplying said first control voltage to the second electrode means of selected of said stages at a first level to create a conduction path between the first region and first electrode means of these stages, and for supplying said second control voltage to the third electrode means of said selected stages at a second level to create a potential barrier between the second region and first electrode means of said selected stages, and for supplying to the second and third electrode means of the remaining stages, said first control voltage at said second level and said second control voltage at said first level, respectively.

6. In the combination as set forth in claim 5, further including:
means for supplying packets of charge essentially of fixed size to said first and second lines, respectively, during each readout period, that is, during a period of time when charge is present beneath said floating gates.

7. In the combination as set forth in claim 6, further including:
means operative after said packets of charge have been supplied to said first and second lines and still during each readout period, for changing the potential on said first and second lines to cause all first and second regions to operate as drains; and
means for sensing the current flowing in each said line when said first and second regions are operating as drains.

8. In combination:
a charge coupled device (CCD) delay line which includes a plurality of floating gates for producing a plurality of output signals in parallel; and
a programmable output circuit, said output circuit comprising:
first and second sense lines;
a common substrate of given conductivity type;
a plurality of stages, equal in number to the plurality of floating gates, each such stage coupled to a different floating gate, each such stage including:
first electrode means coupled to a floating gate, said first electrode means being installed from the substrate;
first and second regions in said substrate of opposite conductivity type than the substrate, each spaced from said first electrode means, said first region coupled to said first sense line and said second region coupled to said second sense line;
second and third electrode means, both insulated from said substrate and from said first electrode means, said second electrode means extending between said first region and said first electrode means for controlling in response to a single first control voltage whose level can be controlled, the conduction of charge between said first region and said first electrode means, and said second electrode means extending between said second region and said first electrode means for controlling in response to a single second control voltage whose level can be controlled, the flow of charge between said second region and said first electrode means; and
means for applying potentials to said first and second regions for permitting each to operate as a source of charge carriers for said substrate region beneath said first electrode means, the passage of such charge carriers being under the control of said second and third electrode means, respectively, and for applying potentials to said first and second regions for permitting each to operate as a drain for charge carriers from the substrate region beneath said first electrode means, the passage of such charge carriers being under the control of said second and third electrode means, respectively.

* * * * *

UNITED STATES PATENT AND TRADEMARK OFFICE
CERTIFICATE OF CORRECTION

PATENT NO. : 4,140,923

DATED : February 20, 1979

INVENTOR(S): Eric Peter Herrmann

It is certified that error appears in the above-identified patent and that said Letters Patent is hereby corrected as shown below:

Column 4, line 33, "charge" should be --change--.

Column 7, line 25, "flowing" should be --floating--.

line 62, "sensor" should be --sense--.

Column 8, line 52, "signal" should be --single--.

Column 9, line 28, "10," should be --3,--.

Column 10, line 36, "installed" should be --insulated--.

Signed and Sealed this

Eighth Day of May 1979

[SEAL]

Attest:

RUTH C. MASON
Attesting Officer

DONALD W. BANNER
Commissioner of Patents and Trademarks